(12) United States Patent
Yoganandan et al.

(10) Patent No.: US 6,949,771 B2
(45) Date of Patent: Sep. 27, 2005

(54) LIGHT SOURCE

(75) Inventors: Sundar A/L Natarajan Yoganandan, Penang (MY); Seong Choon Lim, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 157 days.

(21) Appl. No.: 10/128,446

(22) Filed: Apr. 23, 2002

(65) Prior Publication Data

US 2002/0163006 A1 Nov. 7, 2002

(30) Foreign Application Priority Data

Apr. 25, 2001 (MY) .................................. PI 2001 1952

(51) Int. Cl.⁷ .............................................. H01L 33/00
(52) U.S. Cl. ....................................................... 257/99
(58) Field of Search ....................... 257/79, 81, 98–100

(56) References Cited

U.S. PATENT DOCUMENTS

| | | | | |
|---|---|---|---|---|
| 4,040,078 A | * | 8/1977 | Eckton et al. .............. | 250/551 |
| 5,177,593 A | * | 1/1993 | Abe ............................ | 257/98 |
| 5,298,768 A | * | 3/1994 | Okazaki et al. ............... | 257/81 |
| 5,475,261 A | * | 12/1995 | Tanizawa ..................... | 257/693 |
| 5,744,857 A | * | 4/1998 | Yamamoto ................... | 257/622 |
| 5,905,275 A | * | 5/1999 | Nunoue et al. ............... | 257/95 |
| 6,060,729 A | * | 5/2000 | Suzuki et al. ................ | 257/99 |
| 6,459,130 B1 | * | 10/2002 | Arndt et al. ................. | 257/432 |
| 6,495,861 B1 | * | 12/2002 | Ishinaga ...................... | 257/99 |
| 6,531,328 B1 | * | 3/2003 | Chen ........................... | 438/26 |
| 6,593,598 B2 | * | 7/2003 | Ishinaga ...................... | 257/98 |
| 6,645,783 B1 | * | 11/2003 | Brunner et al. ............... | 438/26 |
| 2001/0030326 A1 | * | 10/2001 | Reeh et al. ................... | 257/98 |
| 2002/0050779 A1 | * | 5/2002 | Yu .............................. | 313/483 |
| 2002/0175621 A1 | * | 11/2002 | Song et al. .................. | 313/515 |
| 2003/0071368 A1 | * | 4/2003 | Rubinsztajn ................ | 257/793 |

FOREIGN PATENT DOCUMENTS

| JP | 52-47692 | * | 4/1977 |
|---|---|---|---|
| JP | 355107283 | * | 8/1980 |

* cited by examiner

Primary Examiner—David A. Zarneke

(57) ABSTRACT

A light source suitable for surface mounting onto a printed circuit board. The light source includes a planar substrate with a centrally positioned aperture. A light emitting diode is mounted on a metallic layer covering the bottom of the aperture, and is encapsulated by a transparent encapsulant material. The metallic layer provides a thermal path for heat generated by the light emitting diode.

11 Claims, 14 Drawing Sheets

LIGHT SOURCE

BACKGROUND OF THE INVENTION

This invention relates to a light source. In particular, the invention relates to a high-power light source in the form of a light emitting diode (LED) package.

Light emitting diodes (LEDs) fabricated from silicon wafer are commonly used to generate light in a variety of applications ranging from simple low-power indication lights to higher-power LED traffic light clusters and LED matrix video displays. Typically, the light emitting diode die is assembled into a sealed package containing electrical connections between the die and terminal pads exposed on an outer surface of the package. Such a package enables simple connection of the diode to external circuitry and, due the sealing properties of the package, protects the die from external damage.

Recently, there has been a drive to make smaller surface mount LED packages which allow the LED to be reliably mounted onto a printed circuit board substrate at relatively high speeds. By making individual LED packages smaller, the number of LED dies per unit area in a multiple LED package may be increased. Furthermore, when the LED is mounted onto a circuit board, the thickness of the assembled circuit board can be reduced.

Today's surface mount LED packages are available in a wide variety of configurations. FIG. 1 shows one typical surface mount LED package 100 comprising an LED die 110 mounted on a circuit board substrate 120 with a transparent material 130 encapsulating the LED 110. The package includes a pair of conductive interconnects 140, 142 for coupling the LED to external circuitry. A first electrode on the bottom surface of the LED 110 is mounted on and electrically coupled to one of the pair of conductive interconnects 140. A very small wire 144 is then "wire bonded" or welded at one end to a second electrode on the top surface of the LED 110, and at the other end to the other one of the pair of conductive interconnects 142.

A drawback with the LED package of FIG. 1 is its inefficiency in dissipating heat away from the LED die 110. The circuit board substrate 120 and the transparent encapsulant material 130 are typically made from thermally insulating materials which "trap" heat in LED die 110. For example, the circuit board material FR4 has a thermal conductivity coefficient of 0.2–0.3 watts per meter kelvin, while the encapsulant material Able-Bond 826 has a thermal conductivity coefficient of approximately 2 watts per meter kelvin. Better heat conductivity is provided by the conductive interconnects 140, 142 which if made from copper would have a thermal conductivity coefficient of 400 watts per meter kelvin. However, the rate of heat dissipation from the conductive interconnects is severely limited by i) the small cross-sectional area of the interconnects, and ii) the relatively large distance of the heat path offered by the interconnects.

Demand for higher brightness surface mount LED packages is increasing in many fields such as in automotive and decorative lighting applications. Higher brightness can be achieved by increasing the current or power supplied to the LED die.

The poor heat dissipation properties of the LED package of FIG. 1 limit the ability of the package to operate at higher power and thus increased brightness. Without efficient heat dissipation, the increased power supplied to the package rapidly increases the temperature of the die resulting in poor light extraction efficiency and even permanent damage to the die.

SUMMARY OF THE INVENTION

According to a first aspect of the present invention, there is provided a light source comprising; a substrate having opposing first and second surfaces, the substrate defining an aperture extending between the first and second surfaces, a platform covering an opening of the aperture adjacent the first surface, a light emitting diode mounted on the platform within the aperture, and a transparent encapsulant material encapsulating the light emitting diode in the aperture.

A light source in accordance with the invention has the advantage that the platform on which the light emitting diode is mounted may provide a very efficient heat dissipating thermal path directly to an external surface of the light source. This in turn allows the light source to be driven at a higher power resulting in an increased light intensity output by the light source. The aperture in the substrate allows the substrate to be made from a thermally insulating material without affecting the flow of heat from the die through the platform. Preferably, the first surface of the substrate forms a lower surface of the light source for surface mounting the light source onto a circuit board substrate. Advantageously, the encapsulant material may provide a focussing dome for focussing light emitted by the light emitting diode.

Ideally, the aperture comprises a side wall tapering outwards towards the second surface. The side wall may, for example, be conically shaped like a reflector cup. The side wall extends between the first and second surfaces of the substrate and is inclined to reflect light from the light emitting diode out of the aperture through the opening adjacent the second surface.

In a preferred embodiment, the platform extends over the first surface and over the side wall of the substrate. This has the advantage of holding the platform firmly in place on the substrate, thus preventing it from detaching easily.

Suitably, the platform is made from a thermally conductive material such as metal for conducting heat away from the light emitting diode, and is configured such that a first surface faces the aperture on which the light emitting diode is mounted, and an opposite second surface is exposed on the outside of the light source. Consequently, the thermal path is provided from the first surface of the platform to the second surface of the platform. Advantageously, the distance from the first surface to the second surface of the platform may be minimised to minimise the length of the thermal path and make it more efficient at dissipating heat.

A light source in accordance with the invention also has the advantage that by mounting the light emitting diode in the aperture of the substrate the package occupies a smaller volume.

According to a second aspect of the present invention, there is provided a method of manufacturing a light source comprising: providing a substrate with opposing first and second surfaces, plating a first surface of the substrate with a metallic layer, drilling a hole through the substrate from the second surface up to the metallic layer on the first surface such that the metallic layer provides a platform covering the opening of the aperture adjacent the first surface, mounting a light emitting diode on the platform within the aperture, and encapsulating the light emitting diode in the aperture with a transparent encapsulant material.

In a preferred embodiment, the platform and the side wall of the aperture is plated with another metallic layer after the drilling step.

BRIEF DESCRIPTION OF THE DRAWINGS

Embodiments of the invention will now be described, by way of example, with reference to the accompanying drawings, in which.

DETAILED DESCRIPTION

Figure 2:
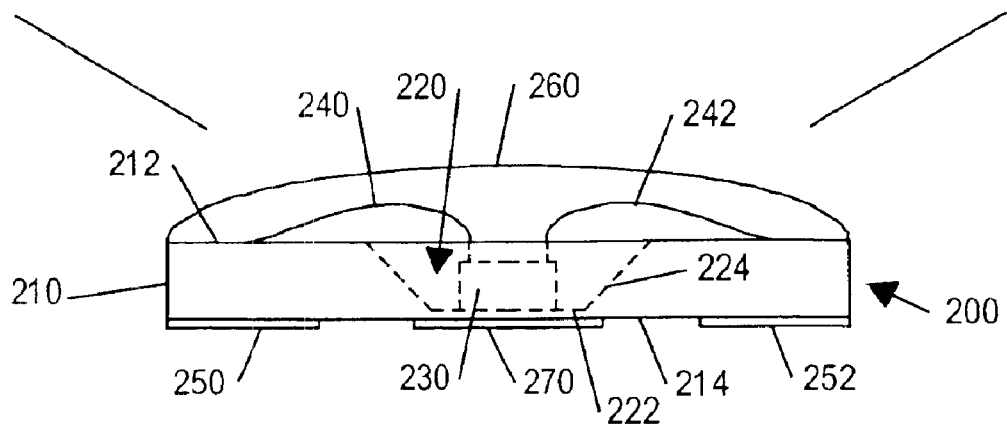
FIG. 2 is an orthogonal projection showing front, plan and side views of a surface mount LED package in accordance with the invention.
Figure 2:
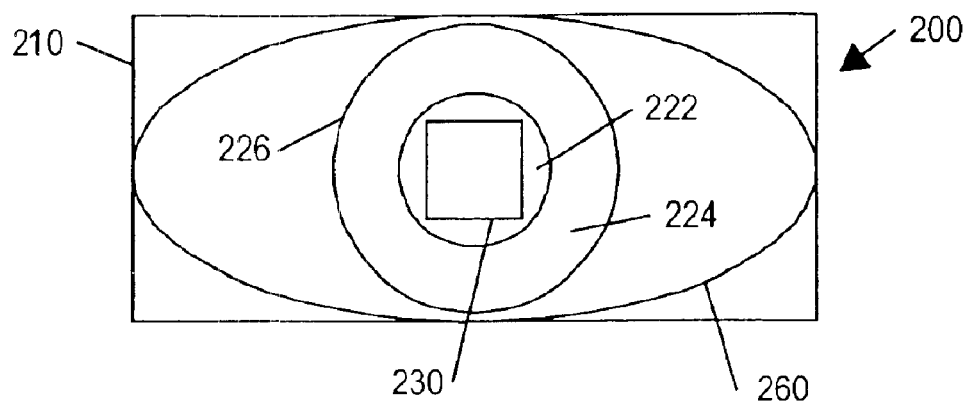
Figure 2:
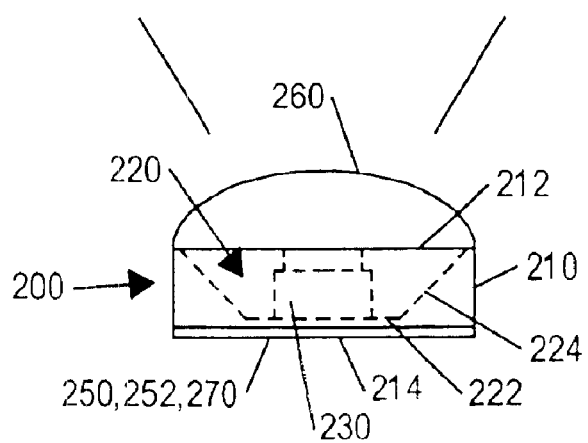

Referring to FIG. 2, there is shown schematically an LED package 200 which can be surface mounted onto a printed circuit board by, for example, reflow soldering or possibly manual soldering.

The surface mount LED package 200 includes a rectangular planar substrate 210, such as an epoxy or glass laminate, a polyester or polyamide board, a bismaleimidetraizine (BT) resin board, or a thermosetting polyphenylene ether board. An upper surface 212 of the substrate includes a conic-section shaped recess 220 positioned centrally on the upper surface. The recess 220 comprises a generally circular floor 222, and a curved side wall 224 tapering concentrically outwards from the floor towards a circular edge 226 on the upper surface 212.

The light emitting element of the LED package 200 is provided by a light emitting diode (LED) die 230 which is mounted centrally in the recess 220 of the substrate 210. As illustrated in the front view of the LED package, two thin gold wires 240, 242 are electrically coupled at one end to the LED die 230 in order to supply an electric current across a semiconductor junction of the LED die. The other ends of the gold wires 240, 242 are electrically coupled to respective terminals on the upper surface 212 of the substrate 210.

The terminals on the upper surface 212 are in turn coupled to a pair of conductive pads 250, 252 on a lower surface 214 of the substrate 210 by a pair of electrically conductive vias, further details of which will be described later. The pair of conductive pads 250, 252 which are exposed on the lower surface of the substrate provide two generally planar surfaces suitable for surface mounting the bottom of the LED package onto a printed circuit board.

In order to efficiently dissipate heat away from the LED die 230, the LED package is provided with a thermal dissipation pad 270 located on the lower surface 214 of the substrate. The pad 270 extends into the bulk of the package 200 through an aperture formed in the substrate 210. The pad 270 effectively covers the lower opening of the aperture adjacent the lower surface 214 to form the recess 220. The pad 270 actually provides the circular floor 222 of the recess, and extends as a layer over the side surface of the aperture to form the side walls 224.

The pad 270 is made from metal, preferably copper plated with nickel, and provides a platform to support the LED die 230 and to conduct heat from the LED die 230 to the exposed lower surface of the package 200. The distance from the bottom of the LED die to the exposed surface of the pad/platform 270 is relatively small compared to the overall dimensions of the package, and the cross-sectional area of the pad/platform 270 for heat to flow through is as large as the area of the mounting surface of the LED die 230. Thus, the pad/platform 270 provides an efficient heat path from the die to an external surface of the package. Furthermore, the exposed surface of the pad 270 is ideally located for soldering to a heat sink of a printed circuit board on which the package may be surface mounted.

A transparent or translucent encapsulant material 260 is bonded to the upper surface 212 of the substrate 210 so as to encapsulate the terminals on the upper surface 212, the gold wires 240, 242, and the LED die 230. The encapsulant material is shaped to form a focussing ellipsoidal dome over the light emitting diode. The ellipsoidal shape of the encapsulation dome optimises the surface mount LED package for use in applications such as video matrix displays.

Figure 1:
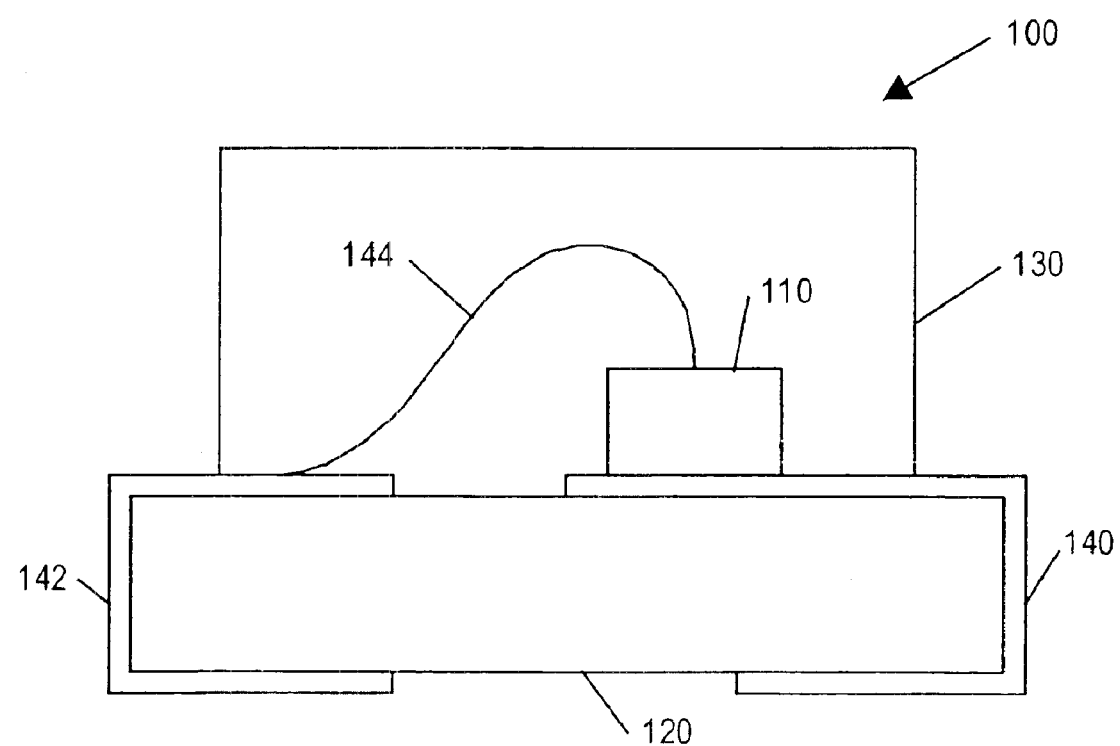
FIG. 1 is a cross-sectional side view of a known surface mount LED package.

The circular floor 222 and the side walls 224 of the recess 220 are provided by the pad/platform 270 which presents a silvered nickel surface to the LED die 230. Light emitted by the LED die 230 is reflected by the silvered surface of the circular floor 222 and the side walls 224 in an upwards direction for focussing by the encapsulant material 260. The recess 220 provided by the aperture in the substrate thus performs the dual function of reflecting light from the LED die 230 much like a standard reflector cup, and enabling efficient heat dissipation from the LED die 230. Moreover, by mounting the LED die in the recess 220, the height of the package 200 can be considerably reduced over known packages such as the package 100 in FIG. 1.

As illustrated in FIG. 2, the major axis radius of curvature of the ellipse shown in the front view is relatively large so as to provide a wide viewing angle of approximately 120 degrees. Such a wide viewing angle would be ideally configured in the horizontal plane as is well known in the field of video displays. In contrast, the minor axis radius of curvature of the ellipse shown in the side view is relatively small so as to provide a narrow viewing angle of approximately 60 degrees. Such as narrow viewing angle would be ideally configured in the vertical plane as is well known in the field of video displays.

Figure 23:
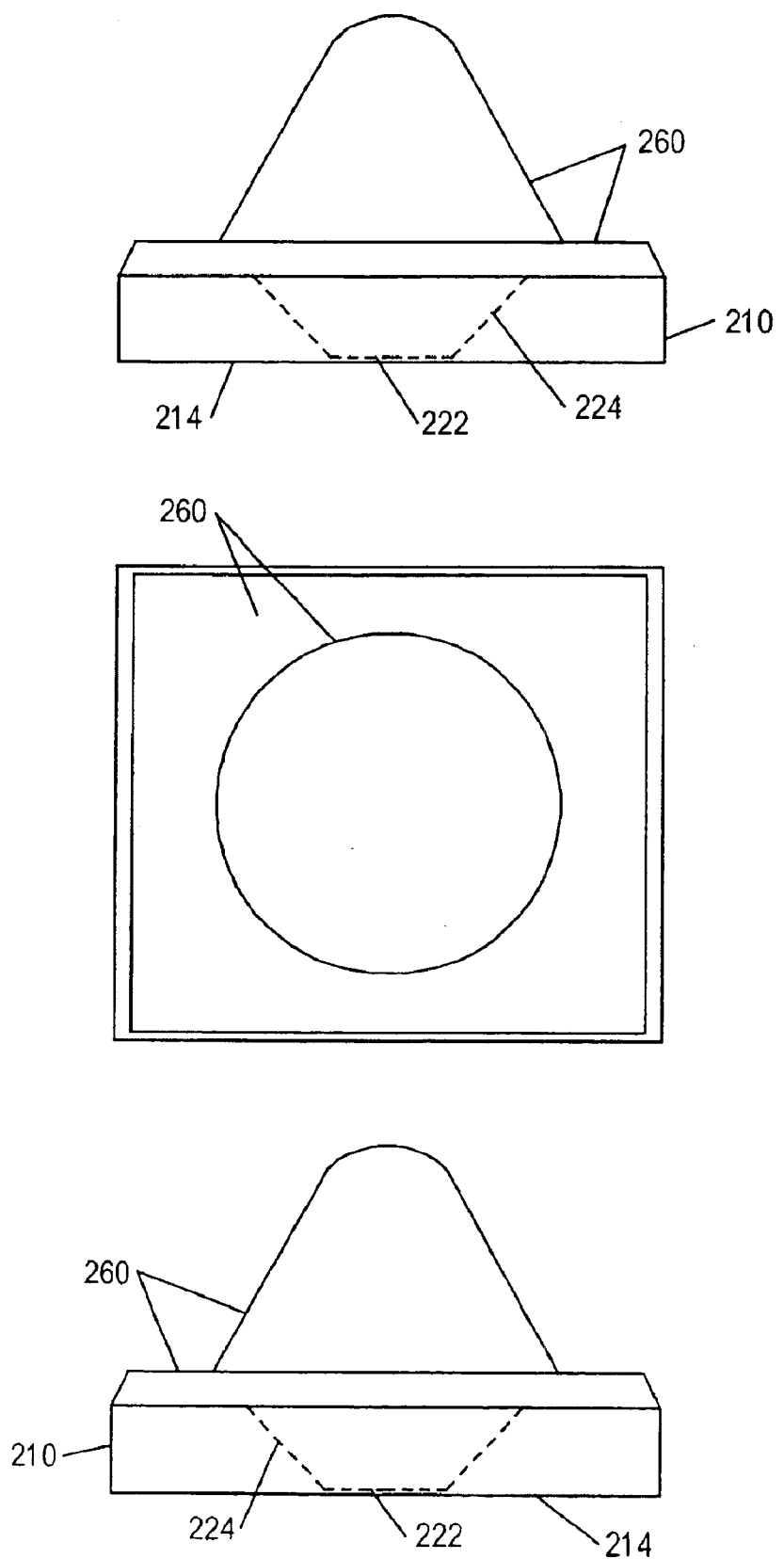
FIG. 23 is an alternative design for the surface mount LED package of FIG. 2 with a pyramid-like encapsulant material.

An alternative to the LED package 200 configuration of FIG. 2 is shown in FIG. 23. This package is more square shaped with dimensions of approximately 3.2 mm long by 2.8 mm wide by 2 mm in height. The shape of the encapsulant material 260 has been modified to form a pyramid-like dome portion over the light emitting diode, and at the base of the pyramid, a planar portion covering the whole upper surface of the substrate 210.

Figure 3:
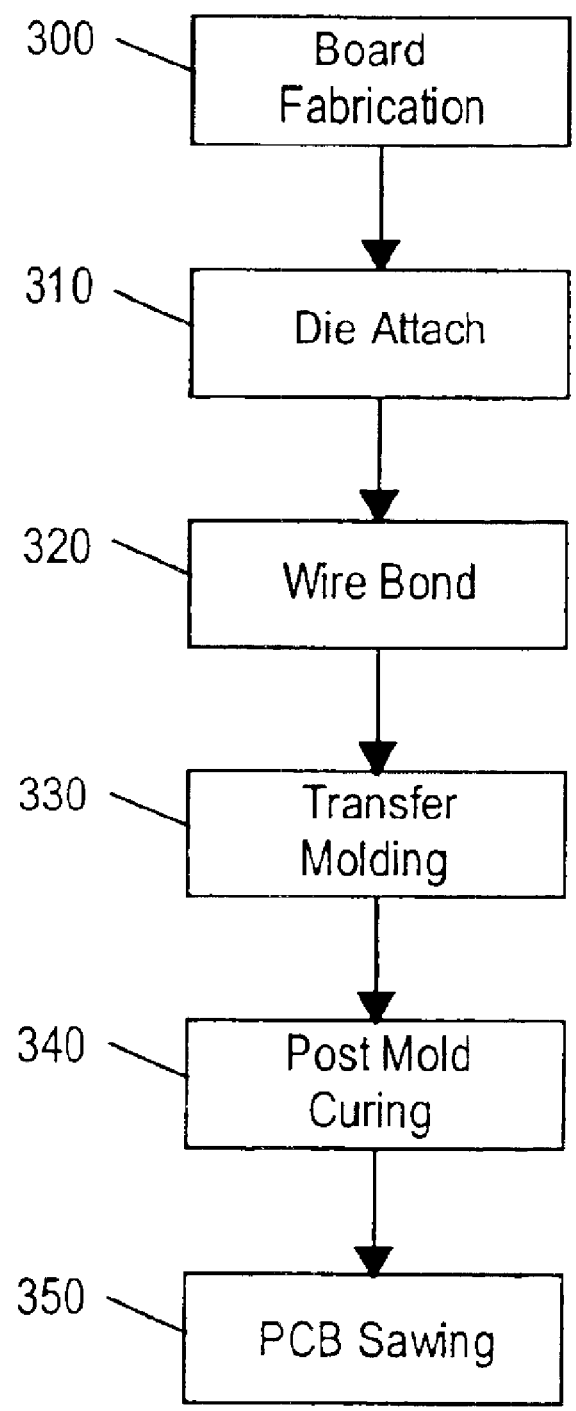
FIG. 3 is a flowchart illustrating exemplary steps employed during the manufacture of the surface mount LED package shown in FIG. 2.

FIG. 3 is a flowchart illustrating, by way of example, the process steps 300 to 350 employed during the manufacture of the surface mount LED package shown in FIG. 2.

In the interests of speed and efficiency, the manufacturing process is actually designed to manufacture multiple surface mount LED packages in one batch. The starting material for the manufacturing process is a large glass-fibre laminate board which is divided into an array or grid of identical rectangular units. Such a board may, for example, be an FR4 type substrate with a glass transition phase of 180 degrees centigrade. Preferably, the board has an array of units 40 units wide by 20 units long, and has dimensions of approximately 70 millimeters by 70 millimeters by 0.5 millimeters.

Each rectangular unit on the board forms the basis of the rectangular substrate 210 of the LED package in FIG. 2. The same processing steps 300, 310, 320, 330, and 340 are applied to each rectangular unit prior to physical separation of the individual units in the sawing step 350. The processing of multiple units on a large board enables the units to be handled more accurately. In the following description, the processing steps will be explained with reference to a single rectangular unit on the board. However, it is understood that the steps will apply to all units on the board.

Board Fabrication

The first step 300 in the manufacturing process involves preparing the units of the board for the die attach step 310. The board fabrication step 300 is illustrated sequentially in FIGS. 4 to 14.

Figure 4:
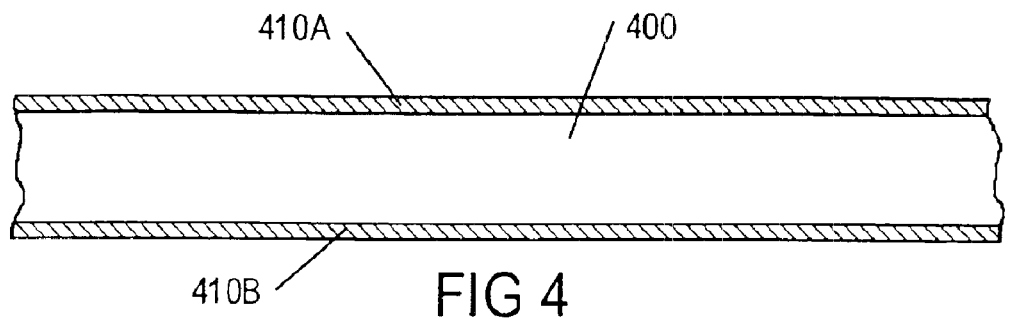
FIGS. 4 to 17 are cross-sectional side views of the surface mount LED package of FIG. 2 at different stages in a manufacturing process.

Referring to FIG. 4, the bare glass-fiber board unit 400 is first plated on the upper and lower surfaces with copper 410A, 410B using standard plating techniques. The board unit 400 is 0.36 mm thick and each copper plating 410A, 410B is 0.07 mm thick such that the total board thickness is 0.5 mm.

Figure 5:
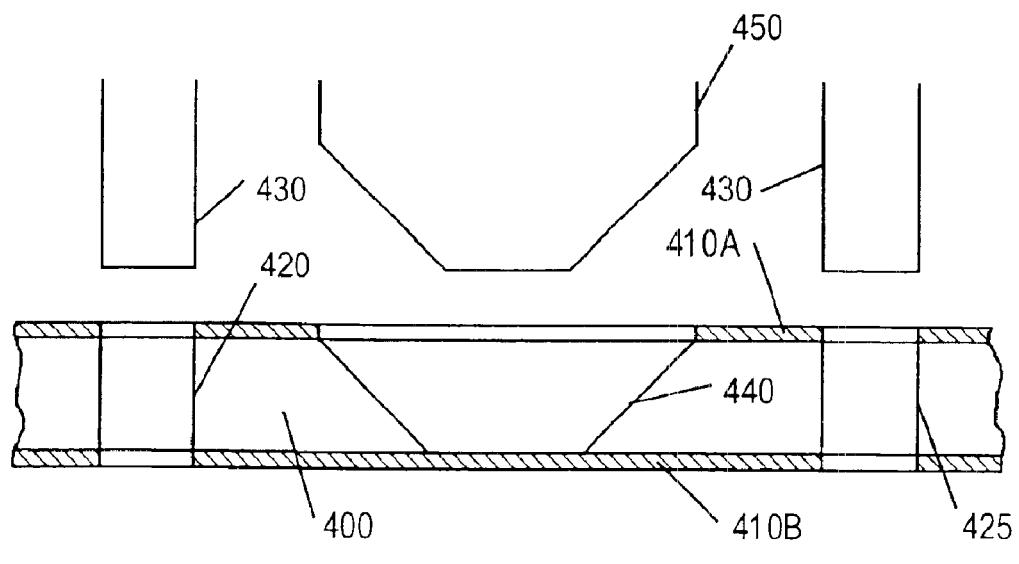
Figure 24:
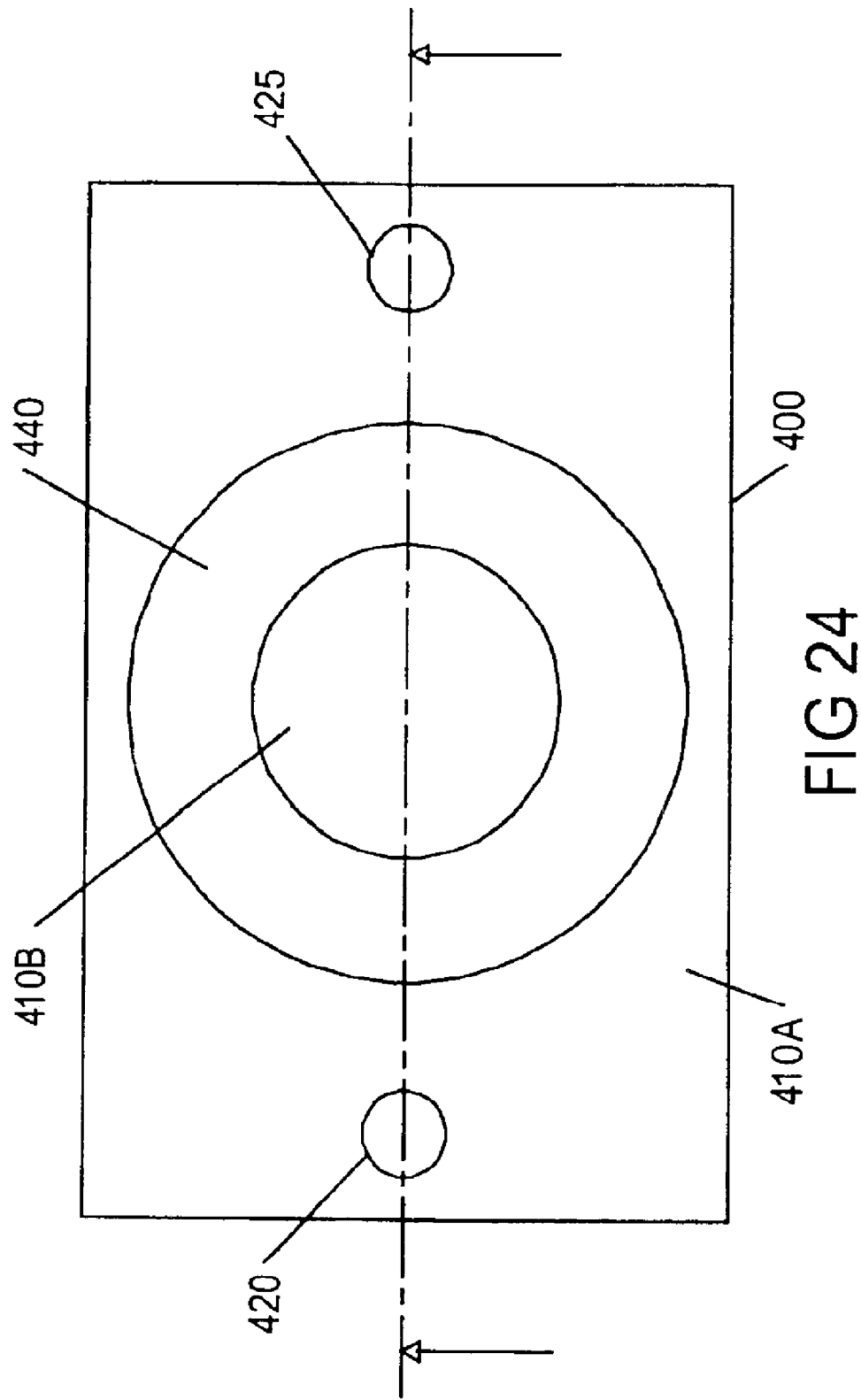
FIG. 24 is a plan view showing the top of the surface mount package of FIG. 5.

After copper plating, each rectangular unit 400 on the board is drilled with two differently shaped drill bits 430, 450 as illustrated in FIG. 5. With further reference to FIG. 24, two holes 420, 425 on opposite sides of the rectangular unit are drilled using a first cylindrically shaped drill bit 430. These via-like holes 420, 425 extend between the upper and lower surfaces of the board and through the copper platings 410A and 410B. Additionally, a conical-section shaped recess is drilled in the upper surface of the board centrally on the rectangular unit by a second cylindrically shaped drill bit 450 having a tapered or chamfered end. The drill bit 450 drills to a depth of 0.45 mm+/−0.02 mm which is sufficient to ensure that an aperture is formed in the board 400 but is not so deep as to drill through the lower copper plating 410B. At the maximum drilling depth of 0.47 mm, 0.03 mm of copper plating is left covering the lower opening of the aperture. At the minimum drilling depth of 0.43 mm, all 0.07 mm of the copper plating is left covering the lower opening of the aperture 440, as shown in FIG. 5.

The drill bits remove copper plating 410 in the drilling areas, leaving surfaces of the board exposed in the two via holes 420, 425 and in the aperture 440. These exposed areas are then coated with a film of graphite such that the whole surface of the unit becomes electrically conductive.

Following the graphite coating, the drilled unit is subjected to a series of photochemical etching processes which selectively deposit metallic layers in predetermined regions on the unit surface. The first photochemical etching processes is illustrated in FIG. 6.

Figure 6:
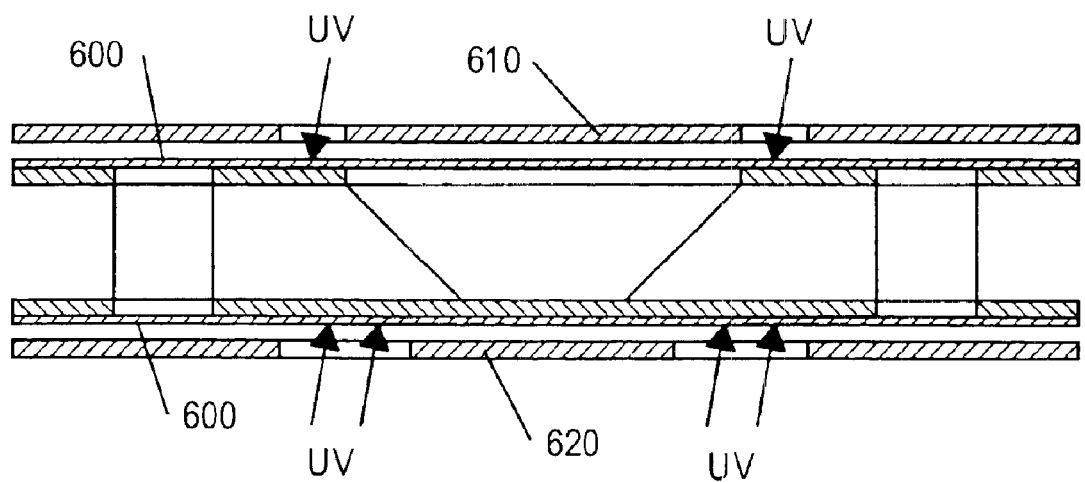
Figure 20:
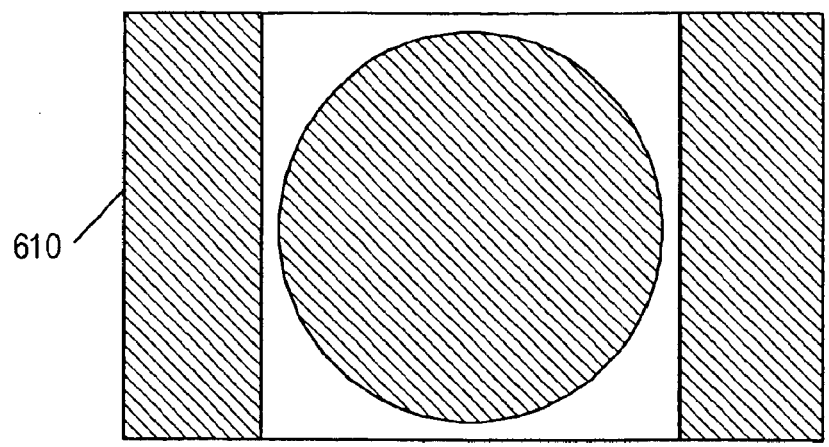
FIGS. 20 to 22 are plan views of UV masks employed in the manufacturing process steps shown in FIGS. 6 and 10.
Figure 21:
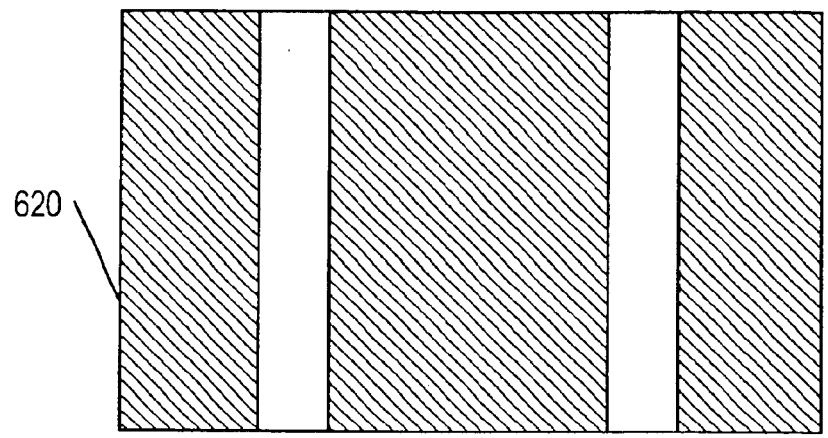

Referring to FIG. 6, the photochemical etching process comprises applying a dry film 600 made from photosensitive resistive material on the upper and lower surfaces of the unit. Photomasks 610, 612 are then applied above and below the upper and lower dry films 600 respectively. The photomasks 610, 612, shown respectively in plan in FIGS. 20 and 21, are generally transparent except for opaque regions which define where a metallic layer should be deposited.

Figure 7:
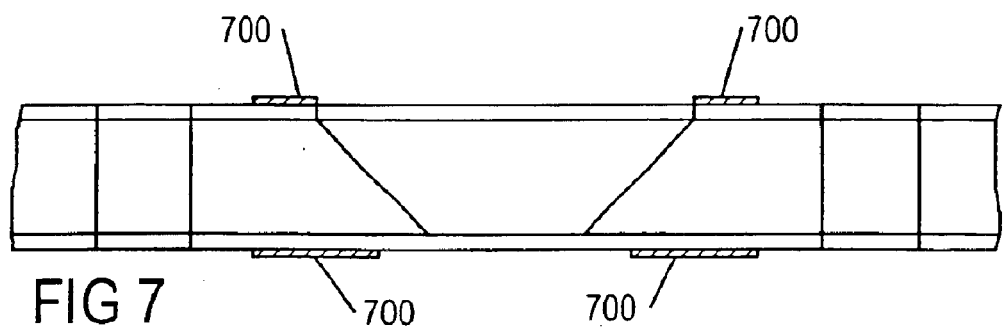

With the photomasks in position, the unit is exposed above and below to ultraviolet (UV) radiation. The regions on the dry film corresponding to the transparent areas on the photomask are selectively hardened by exposure to the UV light. These hardened areas form a chemically-resistant etch mask whilst the unexposed and unhardened regions of the dry film are dissolvable in a suitable etchant, such as chromic acid solution or ferric chloride. Consequently, upon chemically etching away the dry film, an appropriate mask 700 is formed on the upper and lower surfaces of the unit as illustrated in FIG. 7.

Figure 8:
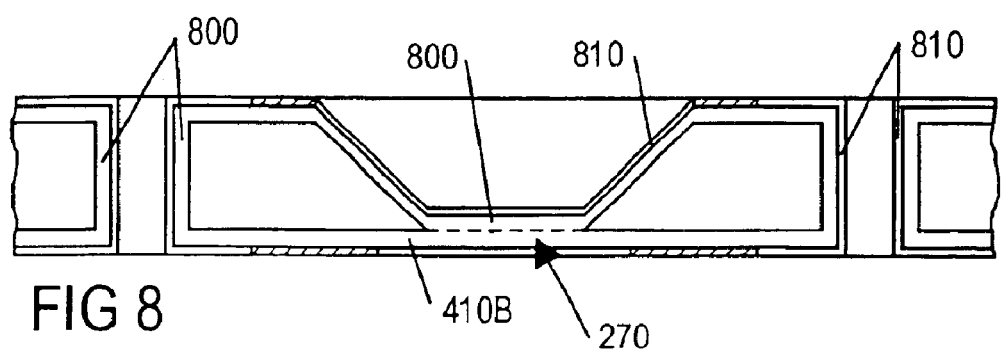

FIG. 8 illustrates the result of electrolytically plating the unit with copper 800 followed by nickel 810. Because the mask is electrically insulating, no plating occurs over the mask region. In contrast, the remainder of the unit is electrically conductive (including the holes and the recess) and so plating occurs everywhere except the mask region. At this stage, the pad/platform 270 has started to form through the bulk of the package at the bottom of the recess. The original copper plating 410B and the later copper plating 800 are integrally joined at the lower opening of the aperture in the substrate, as illustrated by the dashed line in FIG. 8.

Figure 9:
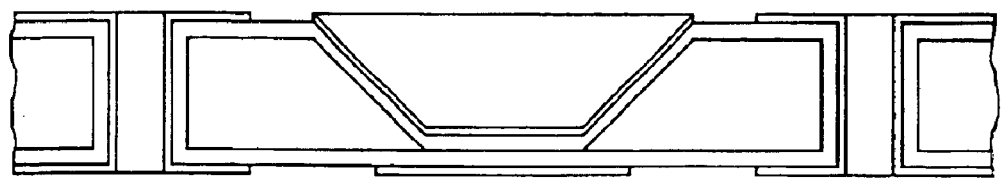
Figure 10:
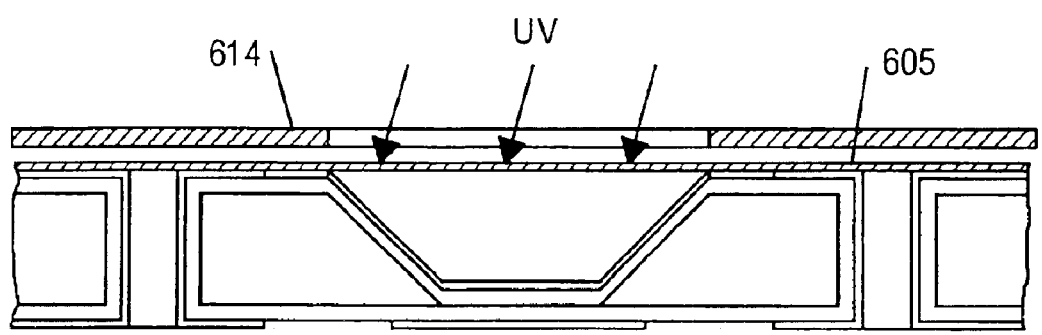

Once the plating process is complete, the hardened mask region can be removed with a suitable hot organic stripper to leave the unit in the form illustrated in FIG. 9.

Figure 11:
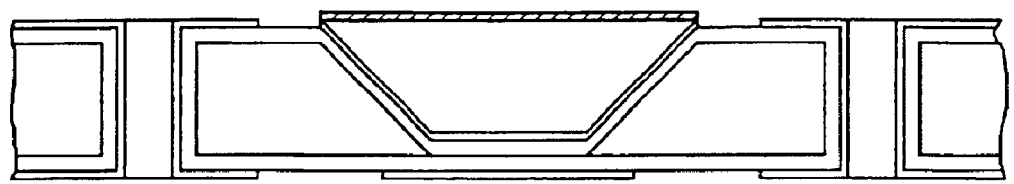
Figure 22:
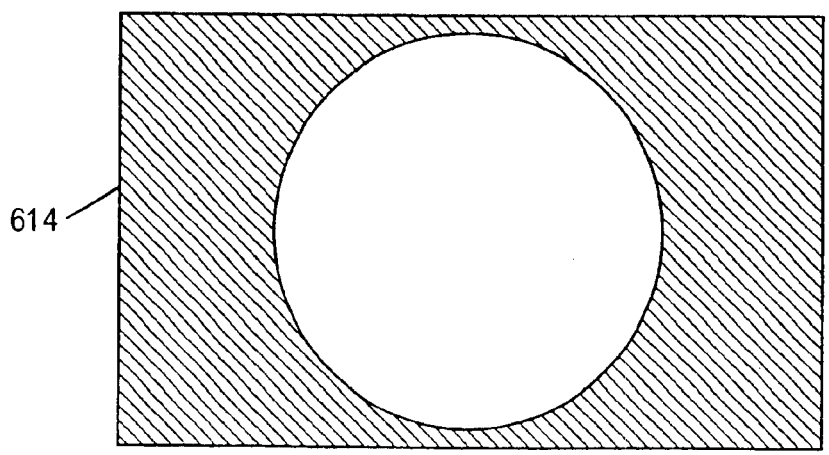

A second photochemical etching process is then applied to the unit on the upper surface only. As before, a dry film 605 made of photosensitive resistive material is applied to the upper surface of the unit. A photomask 614, shown in plan in FIG. 22, is then applied over the dry film and the upper surface of the unit is exposed to UV light. The photomask exposes only the recessed area to UV light such that the dry film hardens over the recess, and remains in place while the obscured regions are dissolved away by means of a suitable etchant. FIG. 11 shows the result of this photomasking.

Figure 12:
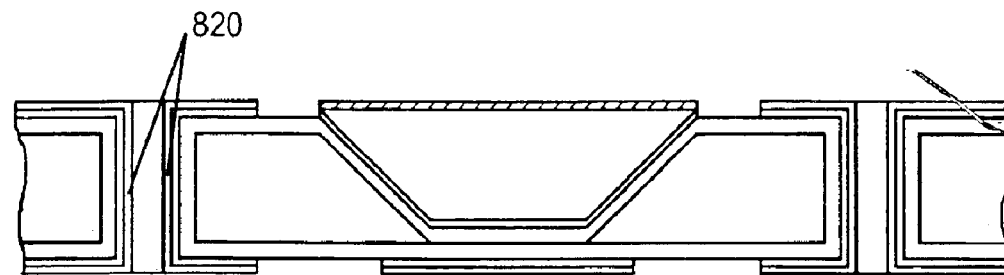
Figure 13:
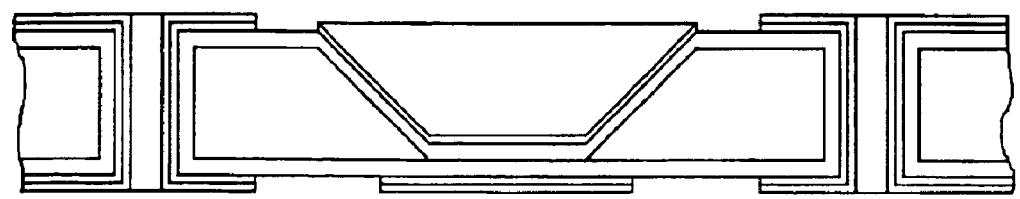

In order to provide improved connectivity to the conductive layers, a coating of flash gold 820 is applied to the unit in FIG. 11. The flash gold only adheres to the nickel plated regions as shown in FIG. 12. The nickel plating provides a passivation layer preventing the copper and gold layers reacting with each other. The recess region does not receive the gold plating due to the hardened dry film masking. Accordingly, the recess advantageously retains the highly reflective quality of the nickel plating. FIG. 13 shows the unit after the hardened mask region has been removed using a suitable hot organic stripper.

Figure 14:
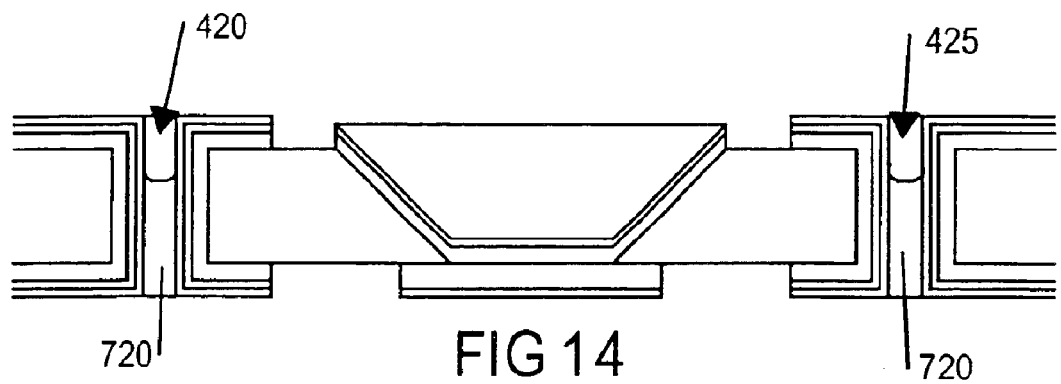

Using a suitable etching chemical, the unwanted copper layers exposed on the outside of the unit 400 are easily removed leaving just the nickel coated recess and the gold coated interconnects as shown in FIG. 14.

The last stage in the board fabrication step 300 is to seal the holes 420, 425 with a thermosetting polymer 720 such as a solder resist. The board is now ready for the die attach step.

Die Attach

Figure 15:
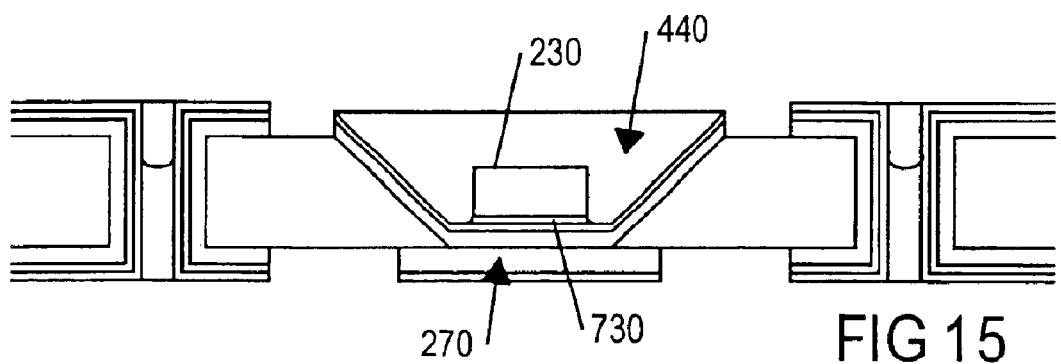

The next step 310 in the manufacturing process is to mount an LED die 230 in the recess 440. The first stage of this die attach step involves dispensing or dotting a small amount of electrically conductive silver epoxy 730 on the floor or base of the recess. The next stage involves picking and placing an LED die 230 onto the silver epoxy in the recess as shown in FIG. 15. The final stage of the die attach step involves curing the silver epoxy together with the rest of the unit in a box oven at approximately 180 degree centigrade for a period of approximately one hour. The cured silver epoxy fixes the die in place in the recess and provides good heat conductivity from the die to the underlying nickel surface of the pad/platform 270.

Wire Bond

A wire bonding step 320 is employed in the present embodiment to electrically couple the two sides of the semiconductor junction of the LED die to two electrically isolated terminals on the upper side of the unit board. The two terminals are provided by the gold plated layers 822, 824 at opposite ends of the unit board.

Figure 16:
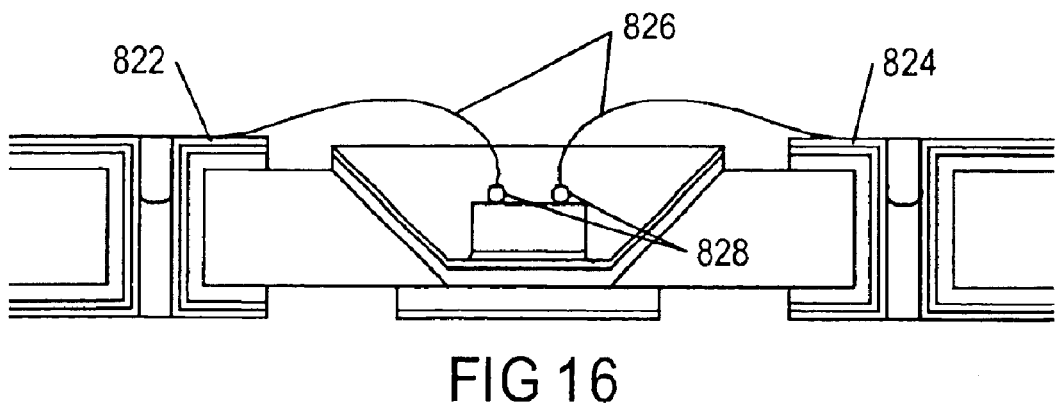

For each of the two wires 826, the wire bonding process creates a ball joint 828 between one end of gold wire and a bond pad on the LED die, and a wedge joint between the other end of the wire and the gold plated terminal on the unit board. A suitable apparatus and method for forming such a wire bond is described in U.S. Pat. No. 4,600,138. The resulting wire bonded LED die is illustrated in FIG. 16.

Transfer Mold

The batch processing of multiple units is completed in the transfer mold step 330 in which an epoxy encapsulant is molded using a known transfer molding process over the upper surface of the unit 400. The mold is of comparable length and width to the original glass fibre board and comprises an array of ellipsoidal mold cups to compliment the array of units on the board. The mold process includes a first step of clamping the mold onto the upper surface of the board such that the array of mold cups are positioned to compliment the array of units on the board. The second step is to "transfer" a molding compound into the mold cups under elevated temperature and pressure conditions. For example, the molding compound could be an MG18 epoxy, available from Dexter Hysol, USA, which is heated to approximately 155 degrees centigrade and is transferred into the mold under a pressure of 1500 kilo Pascals.

Post Mold Cure

Following the encapsulation step, the array of units undergo a post mold curing step 340 in which the units are baked in a box oven for a period of approximately 3 hours at a temperature of approximately 150 degrees centigrade. This curing step hardens the encapsulation epoxy so that it can withstand exposure to external impact and abrasion.

The cured encapsulant serves to focus light emitted from the LED die but also provides a barrier layer that prevents moisture and other materials from contacting and damaging the LED die 30. The cured encapsulated unit is shown in detail in FIG. 17. Many of the features in FIG. 2 are shown in more detail in FIG. 17 and for ease of reference the same labels have been used for equivalent features.

Sawing

Figure 17:
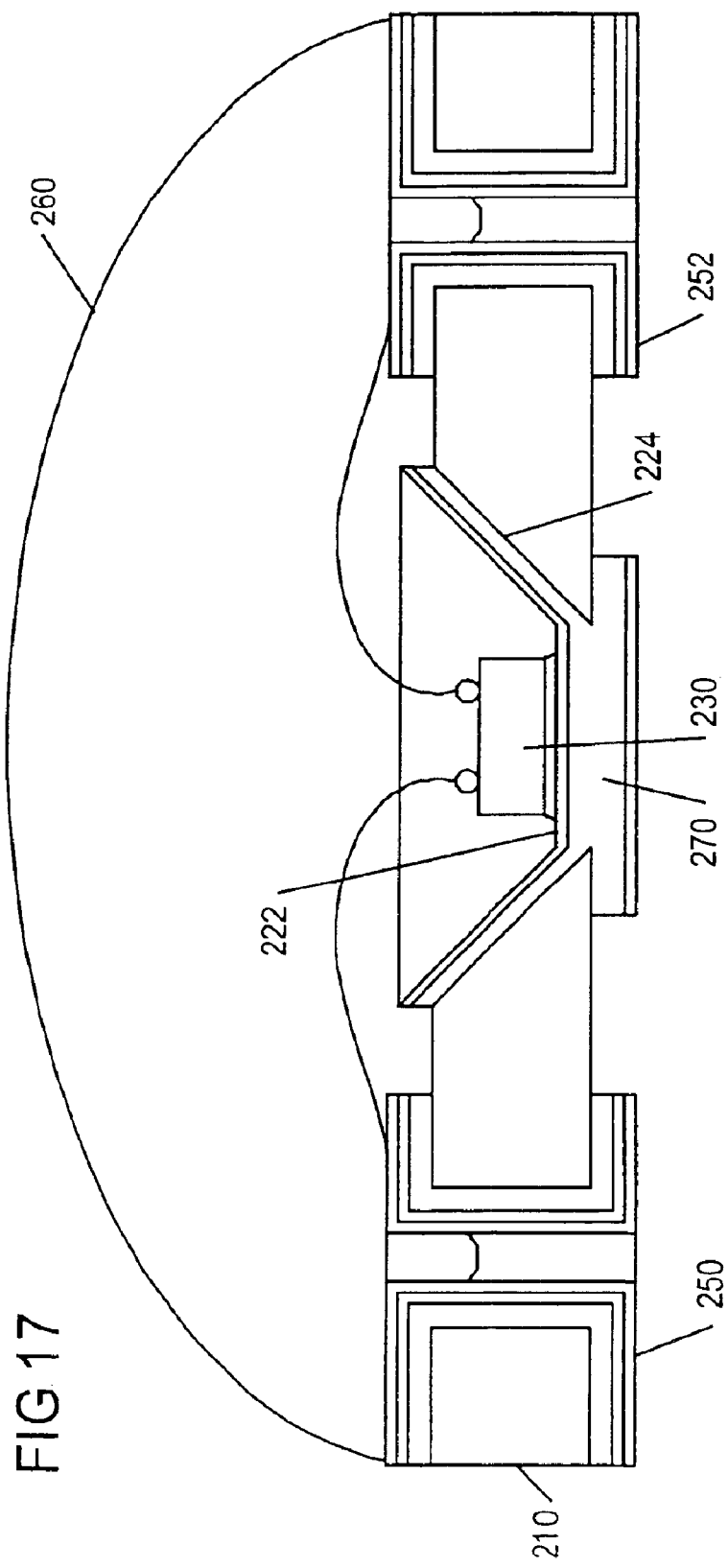
Figure 18:
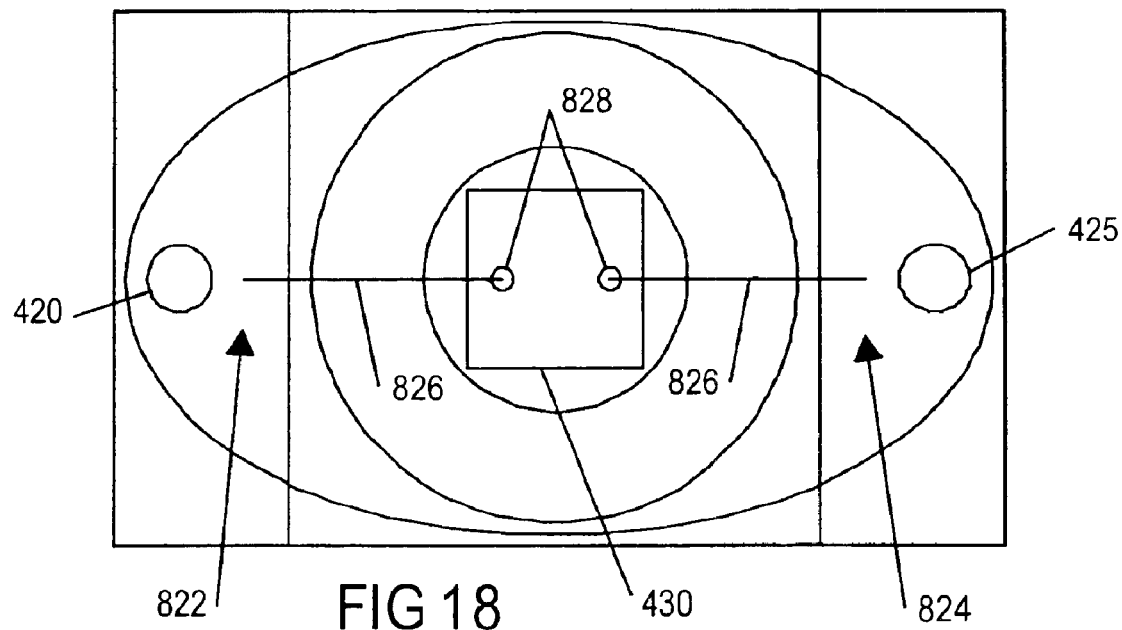
FIG. 18 is a plan view showing the top of the surface mount LED package shown in FIG. 17.
Figure 19:
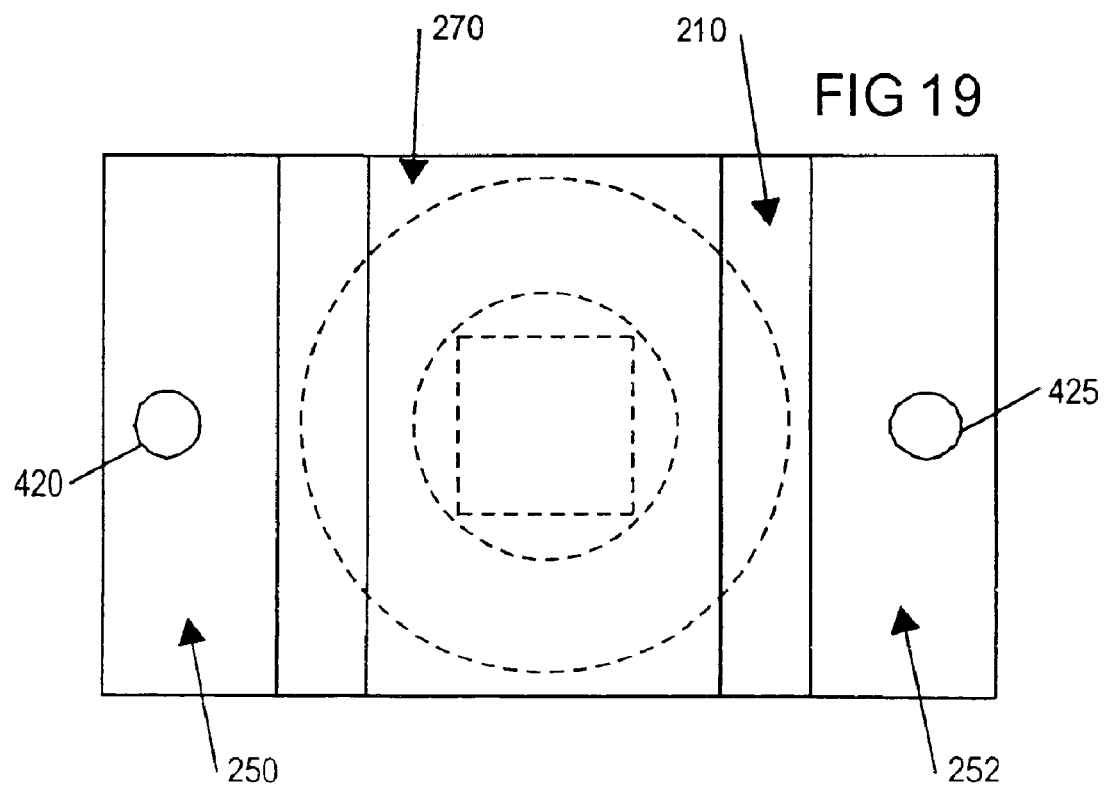
FIG. 19 is a plan view showing the bottom of the surface mount LED package shown in FIG. 17.

Individual LED packages are produced in the final sawing step in which of individual units on the board array are sawn apart. Preferably, a 0.2 millimeter dicing saw, available from Disco Abrasive Systems Inc., Mountain View, Calif., is used to separate the units. Detail views of the final surface mount LED package are shown in FIGS. 17, 18 and 19.

It is to be understood that within the scope of the appended claims the invention may be practiced otherwise than as specifically described. For example, the nickel plating on the recess which presents a silvered surface to the LED die could be replaced with silver plating to form a silvered surface.

What is claimed is:

1. A light source comprising:
a substrate having opposing first and second surfaces, the substrate defining an aperture extending from the first surface to the second surface, said aperture having a first opening in the first surface and second opening in said second surface;
a platform covering said first opening, said platform being located outside of said aperture,
a light emitting diode mounted on the platform within the aperture, and
a transparent encapsulant material encapsulating the light emitting diode in the aperture,
wherein the aperture comprises a side wall tapering outwards towards the second surface, and
wherein the platform extends over the side wall.

2. A light source comprising:
a substrate having opposing first and second surfaces, the substrate defining an aperture extending from the first surface to the second surface, said aperture having a first opening in the first surface and second opening in said second surface,
a platform covering said first opening, said platform being located outside of said aperture,
a light emitting diode mounted on the platform within the aperture, and
a transparent encapsulant material encapsulating the light emitting diode in the aperture,
wherein the platform presets a reflective surface to the light emitting diode.

3. A light source comprising:
a substrate having opposing first and second surfaces, the substrate defining an aperture extending from the first surface to the second surface, said aperture having a first opening in the first surface and second opening in said second surface,
platform covering said first opening, said platform being located outside of said aperture,
a light emitting diode mounted on the platform within the aperture, and
a transparent encapsulant material encapsulating the light emitting diode in the aperture,
wherein the platform is made from thermally conductive material for conducting heat away from the light emitting diode.

4. A light source comprising:
a substrate having opposing first and second surfaces, the substrate defining an aperture extending from the first surface to the second surface, said aperture having a first opening in the first surface and second opening in said second surface,
a platform covering said first opening, said platform being located outside of said aperture,
a light emitting diode mounted on the platform within the aperture, and
a transparent encapsulant material encapsulating the light emitting diode in the aperture,
wherein the platform is made of metal.

5. A light source comprising:
a substrate having opposing first and second surfaces, the substrate defining an aperture extending from the first surface to the second surface, said aperture having a first opening in the first surface and second opening in said second surface,
a platform covering said first opening, said platform being located outside of said aperture,
a light emitting diode mounted on the platform within the aperture, and
a transparent encapsulant material encapsulating the light emitting diode in the aperture,
wherein the platform is made of metal and
wherein the metal platform is plated onto the substrate.

6. A light source comprising:
a substrate having opposing first and second surfaces, the substrate defining an aperture extending from the first surface to the second surface, said aperture having a first opening in the first surface and second opening in said second surface,
a platform covering said first opening, a light emitting diode mounted on the platform within the aperture, and a transparent encapsulant material encapsulating the light emitting diode in the aperture, wherein the platform is made of metal, wherein the metal platform is plated onto the substrate and wherein the metal platform comprises layers of different metals.

7. A light source comprising:

a substrate having opposing first and second surfaces, the substrate defining an aperture extending from the first surface to the second surface, said aperture having a first opening in the first surface and second opening in said second surface, a platform covering said first opening, said platform being located outside of said aperture, a light emitting diode mounted on the platform within the aperture, and a transparent encapsulant material encapsulating the light emitting diode in the aperture, wherein the substrate is made from an electrically and thermally insulating material.

8. A light source comprising:

a substrate having opposing first and second surfaces, the substrate defining an aperture extending from the first surface to the second surface, said aperture having a first opening in the first surface and second opening in said second surface, a platform covering said first opening, said platform being located outside of said aperture, a light emitting diode mounted on the platform within the aperture, and a transparent encapsulant material encapsulating the light emitting diode in the aperture, wherein the transperent encapsulant material is bonded to the second surface of the substrate.

9. A light source as claimed in claim 8, wherein the transparent encapsulant material is molded to form a focusing dome over the light emitting diode.

10. A light source comprising:

a substrate having opposing first and second surfaces, the substrate defining an aperture extending from the first surface to the second surface, said aperture having a first opening in the first surface and second opening in said second surface, a platform covering said first opening, a light emitting diode mounted on the platform within the aperture, a transparent encapsulant material encapsulating the light emitting diode in the aperture, a first electrically-conductive interconnect extending between the first and second surfaces, the first interconnect having a terminal on the second surface coupled to the light emitting diode and an exposed pad on the first surface for coupling to external circuitry, and a second electrically-conductive interconnect extending between the first and second surfaces, the second interconnect having a terminal on the second surface coupled to the light emitting diode and an exposed pad on the first surface for coupling to external circuitry.

11. A light source as claimed in claim 10, wherein the substrate defines first and second vias extending between the upper and lower surfaces, a portion of each of the first and second interconnects extending through the first and second vias respectively.

* * * * *